US009502372B1

(12) United States Patent
Katkar et al.

(10) Patent No.: US 9,502,372 B1
(45) Date of Patent: Nov. 22, 2016

(54) WAFER-LEVEL PACKAGING USING WIRE BOND WIRES IN PLACE OF A REDISTRIBUTION LAYER

(71) Applicant: Invensas Corporation, San Jose, CA (US)

(72) Inventors: Rajesh Katkar, San Jose, CA (US); Tu Tam Vu, San Jose, CA (US); Bongsub Lee, Mountain View, CA (US); Kyong-Mo Bang, Fremont, CA (US); Xuan Li, Santa Clara, CA (US); Long Huynh, Santa Clara, CA (US); Gabriel Z. Guevara, San Jose, CA (US); Akash Agrawal, San Jose, CA (US); Willmar Subido, Garland, TX (US); Laura Wills Mirkarimi, Sunol, CA (US)

(73) Assignee: Invensas Corporation, San Jose, CA (US)

(*) Notice: Subject to any disclaimer, the term of this patent is extended or adjusted under 35 U.S.C. 154(b) by 0 days.

(21) Appl. No.: 14/701,049

(22) Filed: Apr. 30, 2015

(51) Int. Cl.
*H01L 23/00* (2006.01)
*H01L 23/31* (2006.01)
*H01L 25/065* (2006.01)
*H01L 21/56* (2006.01)
*H01L 21/78* (2006.01)

(52) U.S. Cl.
CPC .......... *H01L 24/49* (2013.01); *H01L 21/561* (2013.01); *H01L 21/565* (2013.01); *H01L 21/568* (2013.01); *H01L 21/78* (2013.01); *H01L 23/3114* (2013.01); *H01L 24/85* (2013.01); *H01L 24/96* (2013.01); *H01L 25/0657* (2013.01); *H01L 2224/4801* (2013.01); *H01L 2224/484* (2013.01); *H01L 2224/4845* (2013.01); *H01L 2224/49171* (2013.01); *H01L 2224/49177* (2013.01); *H01L 2224/85005* (2013.01); *H01L2225/06506* (2013.01); *H01L 2924/2064* (2013.01)

(58) Field of Classification Search
CPC ... H01L 24/49; H01L 21/561; H01L 21/565; H01L 21/568; H01L 21/78; H01L 23/3144; H01L 24/85; H01L 24/96; H01L 25/0657; H01L 2224/4801; H01L 2224/484; H01L 2224/4845; H01L 2224/49171
See application file for complete search history.

(56) References Cited

U.S. PATENT DOCUMENTS

| 7,344,917 B2 | 3/2008 | Gautham |
| 8,018,065 B2 | 9/2011 | Lam |

(Continued)

FOREIGN PATENT DOCUMENTS

JP 2004047702 A 2/2004

OTHER PUBLICATIONS

Campos et al., "System in Package Solutions Using Fan-Out Wafer Level Packaging Technology," SEMI Networking Day, Jun. 27, 2013.

*Primary Examiner* — Yasser A Abdelaziez
*Assistant Examiner* — Farun Lu (57) ABSTRACT

An apparatus relates generally to a microelectronic package. In such an apparatus, a microelectronic die has a first surface, a second surface opposite the first surface, and a sidewall surface between the first and second surfaces. A plurality of wire bond wires with proximal ends thereof are coupled to either the first surface or the second surface of the microelectronic die with distal ends of the plurality of wire bond wires extending away from either the first surface or the second surface, respectively, of the microelectronic die. A portion of the plurality of wire bond wires extends outside a perimeter of the microelectronic die into a fan-out ("FO") region. A molding material covers the first surface, the sidewall surface, and portions of the plurality of the wire bond wires from the first surface of the microelectronic die to an outer surface of the molding material.

20 Claims, 8 Drawing Sheets

(56) References Cited

U.S. PATENT DOCUMENTS

| | | | |
|---|---|---|---|
| 8,372,741 B1* | 2/2013 | Co | H01L 24/03 219/56.22 |
| 2005/0176233 A1 | 8/2005 | Joshi et al. | |
| 2009/0146321 A1* | 6/2009 | Beaulieu | H01L 23/055 257/784 |
| 2013/0087915 A1 | 4/2013 | Warren et al. | |
| 2015/0340305 A1* | 11/2015 | Lo | H01L 23/49517 257/666 |

* cited by examiner

WAFER-LEVEL PACKAGING USING WIRE BOND WIRES IN PLACE OF A REDISTRIBUTION LAYER

FIELD

The following description relates to integrated circuits ("ICs"). More particularly, the following description relates to wafer-level packaging using wire bond wires in place of a redistribution layer for an IC.

BACKGROUND

Microelectronic assemblies generally include one or more ICs, such as for example one or more packaged dies ("chips") or one or more dies. One or more of such ICs may be mounted on a circuit platform, such as a wafer such as in wafer-level-packaging ("WLP"), a printed board ("PB"), a printed wiring board ("PWB"), a printed circuit board ("PCB"), a printed wiring assembly ("PWA"), a printed circuit assembly ("PCA"), a package substrate, an interposer, or a chip carrier. Additionally, one IC may be mounted on another IC. An interposer may be an IC, and an interposer may be a passive or an active IC, where the latter includes one or more active devices, such as transistors for example, and the former does not include any active device. Furthermore, an interposer may be formed like a PWB, namely without any circuit elements such as capacitors, resistors, or active devices.

An IC may include conductive elements, such as pathways, traces, tracks, vias, contacts, pads such as contact pads and bond pads, plugs, nodes, or terminals for example, that may be used for making electrical interconnections with a circuit platform. These arrangements may facilitate electrical connections used to provide functionality of ICs. An IC may be coupled to a circuit platform by bonding, such as bonding traces or terminals, for example, of such circuit platform to bond pads or exposed ends of pins or posts or the like of an IC. Additionally, a redistribution layer ("RDL") may be part of an IC to facilitate a flip-chip configuration, die stacking, or more convenient or accessible position of bond pads for example.

An RDL is a thin film technology, which conventionally involves masking operations, etching operations, and deposition operations. Accordingly, forming an RDL may add considerable cost to formation of a chip. Accordingly, it would be desirable and useful to provide a less costly form of interconnecting a chip than an RDL.

BRIEF SUMMARY

An apparatus relates generally to a microelectronic package. In such an apparatus, a microelectronic die has a first surface, a second surface opposite the first surface, and a sidewall surface between the first and second surfaces. A plurality of wire bond wires with proximal ends thereof are coupled to either the first surface or the second surface of the microelectronic die with distal ends of the plurality of wire bond wires extending away from either the first surface or the second surface, respectively, of the microelectronic die. A portion of the plurality of wire bond wires extends outside a perimeter of the microelectronic die into a fan-out ("FO") region. A molding material covers the first surface, the sidewall surface, and portions of the plurality of the wire bond wires from the first surface of the microelectronic die to an outer surface of the molding material.

A method relates generally to wafer-level packaging. In such a method, a substrate is obtained. Microelectronic dies are attached to the substrate to form a die array of the microelectronic dies having gaps between neighboring dies of the microelectronic dies. Proximal ends of wire bond wires are wire bonded to the microelectronic dies. The substrate, including the die array, is covered with a molding material. The covering includes covering at least a majority length of lengths of the wire bond wires wire bonded to the microelectronic dies. At least a portion of the wire bond wires extend outside corresponding perimeters of the microelectronic dies corresponding thereto. Distal ends of the wire bond wires are revealed from the molding material. Interconnects are formed for the distal ends revealed. The die array is diced to provide microelectronic packages.

Other features will be recognized from consideration of the Detailed Description and Claims, which follow.

BRIEF DESCRIPTION OF THE DRAWING(S)

Accompanying drawing(s) show exemplary embodiment(s) in accordance with one or more aspects of exemplary apparatus(es) or method(s). However, the accompanying drawings should not be taken to limit the scope of the claims, but are for explanation and understanding only.

FIGS. 12-1 through 12-3 are top plan views depicting respective exemplary microelectronic packages of different sizes.

DETAILED DESCRIPTION

In the following description, numerous specific details are set forth to provide a more thorough description of the specific examples described herein. It should be apparent, however, to one skilled in the art, that one or more other examples or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Figure 1:
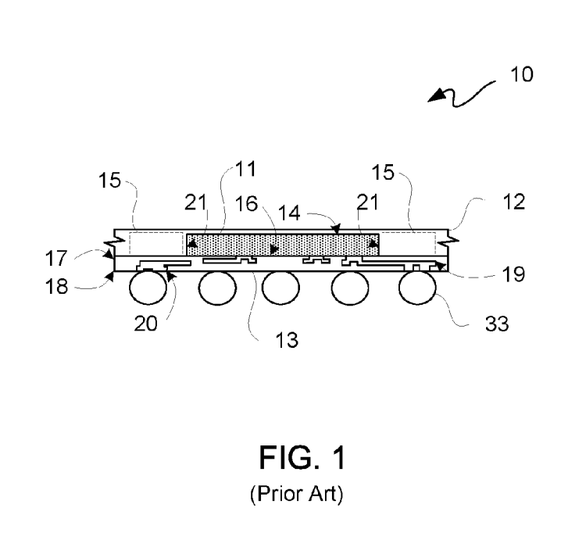
FIG. 1 is a schematic diagram depicting a cross-sectional side view of a portion of a conventional reconstitute wafer.

FIG. 1 is a schematic diagram depicting a cross-sectional side view of a portion of a conventional reconstituted wafer 10. Reconstituted wafer 10 is for fan-out WLP ("FO-WLP"). A microelectronic die or IC chip 11 may be encased between molding material 12 and an RDL 13. Microelectronic die 11 may have an upper surface 14 and a lower surface 16. Use of terms such as "upper" and "lower" or other directional terms is made with respect to the reference frame of the figures and is not meant to be limiting with respect to potential alternative orientations, such as in further assemblies or as used in various systems.

Lower surface 16 may generally be associated with what is referred to as a "front side" of an in-process wafer, and upper surface 14 may generally be associated with what is referred to as a "backside" of an in-process wafer. Along those lines, a front-side of an in-process wafer may be used for forming what is referred to as front-end-of-line ("FEOL") structures and back-end-of-line ("BEOL") structures.

Generally, BEOL structures may include one or more inter-level dielectrics ("ILDs") and one or more levels of metallization. Furthermore, each ILD may be composed of one or more dielectric layers. Additionally, metal from a metallization level may extend through one or more ILDs, as is known. Furthermore, each level of metallization may be composed of one or more metal layers. A passivation level may be formed on a last metallization layer. Such passivation level may include one or more dielectric layers, and further may include an anti-reflective coating ("ARC"). In some applications, such a passivation layer may be referred to as an inter-die layer.

An RDL 13 may be formed on such passivation level. Conventionally, an RDL 13 may include: a dielectric layer 17, such as a polyimide layer for example; a metal layer 19 on such dielectric layer 17 and connected to bond pads of a metal layer of a last metallization level of microelectronic die 11; and another dielectric layer 18, such as another polyimide layer for example, over such metal layer 19 while leaving a portion thereof exposed to provide bond pads 20. A terminal opening may expose such bond pads 20 of such RDL 13 metal layer 19. Thereafter, solder bumps, such as solder balls 33, or wire bonds may be coupled to such bond pads 20.

An RDL 13 metal layer 19, may be formed of a metal such as a copper, copper alloy, aluminum or other metal, and may be formed on such a passivation layer and on lower end contact surfaces of via conductors of microelectronic die 11. Balls 33 may be respectively formed on bonding pads 20, where such pads may be formed on or as part of metal layer 19. Balls 33 may be formed of a bonding material, such as solder or other bonding material. Balls 33 may be microbumps, C4 bumps, copper pillar bumps, ball grid array ("BGA") balls, or some other die interconnect structure. In some applications, metal layer 19 may be referred to as a landing pad.

Formation of an RDL 13 may include lithography, deposition, etch, planarization, among other known operations for formation of an RDL. For example, a seed layer deposition may be before patterning and electroplating to provide conductors for respective solder bump pads or landings. Optionally, a conventional anisotropic etch may be used prior to depositing and patterning a polymer isolation layer as a liner, and a chemical-mechanical-polishing ("CMP") may be used thereafter.

More recently, three-dimensional ("3D") ICs or "3D ICs" have been formed by generally attaching one die to another at a bond pad level or an on-chip electrical wiring level. Microelectronic dies 11 may be diced from a wafer into single dies. Such single dies may be directly coupled to one another or bonded to a platform to provide a reconstituted wafer 10. Along those lines, microelectronic dies 11 may be tested prior to inclusion in reconstituted wafer 10. Such pre-tested prior to inclusion microelectronic dies 11 are sometimes referred to as "known good dies" or "KGDs".

In other examples, one or more RDLs 13 may be formed. An RDL 13 may include numerous conductive traces extending on or within one or more dielectric sheets or layers. Such traces may be provided in one level or in multiple levels throughout a single dielectric layer, separated by portions of dielectric material within such RDL. Vias may be included in an RDL 13 to interconnect traces in different levels of such RDL.

For FO-WLP, reconstituted wafer 10 may have gaps between such dies in which molding material 12 is injected or otherwise deposited to provide a fan-out ("FO") region 15 generally around a sidewall or sidewall surface 21 of microelectronic dies 11 of such reconstituted wafer 10. Accordingly, formation of an RDL 13 for multiple microelectronic dies 11 of a reconstituted wafer 10 may add considerable cost.

Figure 2:
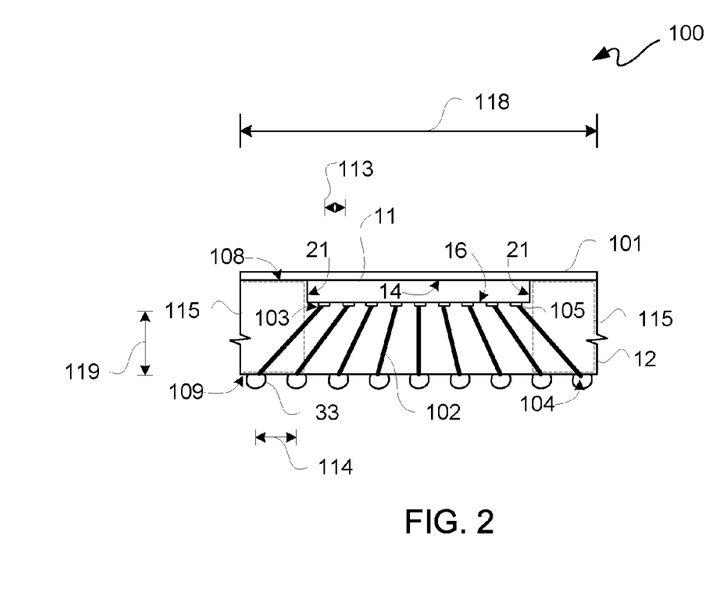
FIG. 2 is a schematic diagram depicting a cross-sectional side view of a portion of a reconstitute wafer.

FIG. 2 is a schematic diagram depicting a cross-sectional side view of a portion of a reconstituted wafer 100. Microelectronic dies 11 may include any of a variety of types of substrates. Examples of such material used for substrates may include silicon (Si), gallium arsenide (GaAs), polymeric, ceramic, carbon-based substrates such as diamond, a silicon carbon (SiC), germanium (Ge), $Si_{1-x}Ge_x$, or the like.

Microelectronic dies 11 may be coupled to a platform 101, such as a substrate 101. Substrate 101 may be a semiconductor substrate. Even though a semiconductor substrate may be used, any sheet or layer of semiconductor material or dielectric material, such as ceramic or glass for example, may be used as a substrate for WLP of reconstituted wafer 100. Furthermore, substrate 101 may, though need not, be present in a final structure.

Microelectronic die 11 may have an upper surface 14, a lower surface 16 opposite upper surface 14, and a sidewall surface 21 between such upper and lower surfaces. Upper surface 14 and lower surface 16 may extend in lateral directions and may be generally parallel to each other at a thickness of microelectronic die 11. Wire bond wires 102 may have proximal ends 103 of wire bond wires 102 coupled to lower surface 16 of microelectronic die 11 with distal ends 104 of wire bond wires 102 extending away from such lower surface 16 of microelectronic die 11. In another implementation, microelectronic die 11 may have proximal ends 103 of wire bond wires 102 coupled to an upper surface 14 of microelectronic die 11 with distal ends 104 of wire bond wires 102 extending away from such upper surface 14 of microelectronic die 11. However, for purposes of clarity and not limitation, it shall be assumed that wire bond wires 102 are coupled to BEOL pads 105 of microelectronic die 11 as part of lower surface 16.

Sidewall surface 21 may define a perimeter of microelectronic die 11. A portion of wire bond wires 102 may extend outside such perimeter die into a FO region 115. Along those lines, a molding material 12 may be injected or otherwise deposited for covering lower surface 16, sidewall surface 21, and wire bond wires 102 from proximal ends 103 coupled to lower surface 16 of microelectronic die 11 to an outer surface 109 of molding material 12 generally opposite an inner surface 108 of substrate 101. An outer perimeter of FO region 115 may extend to an outer perimeter 118 of molding material 12 coverage around a final structure. In other words, generally FO region 115 may provide a 0.1 mm or more extension region or ring around a corresponding microelectronic die 11 after dicing a package from a reconstituted wafer.

Figures 13, 14, 15:
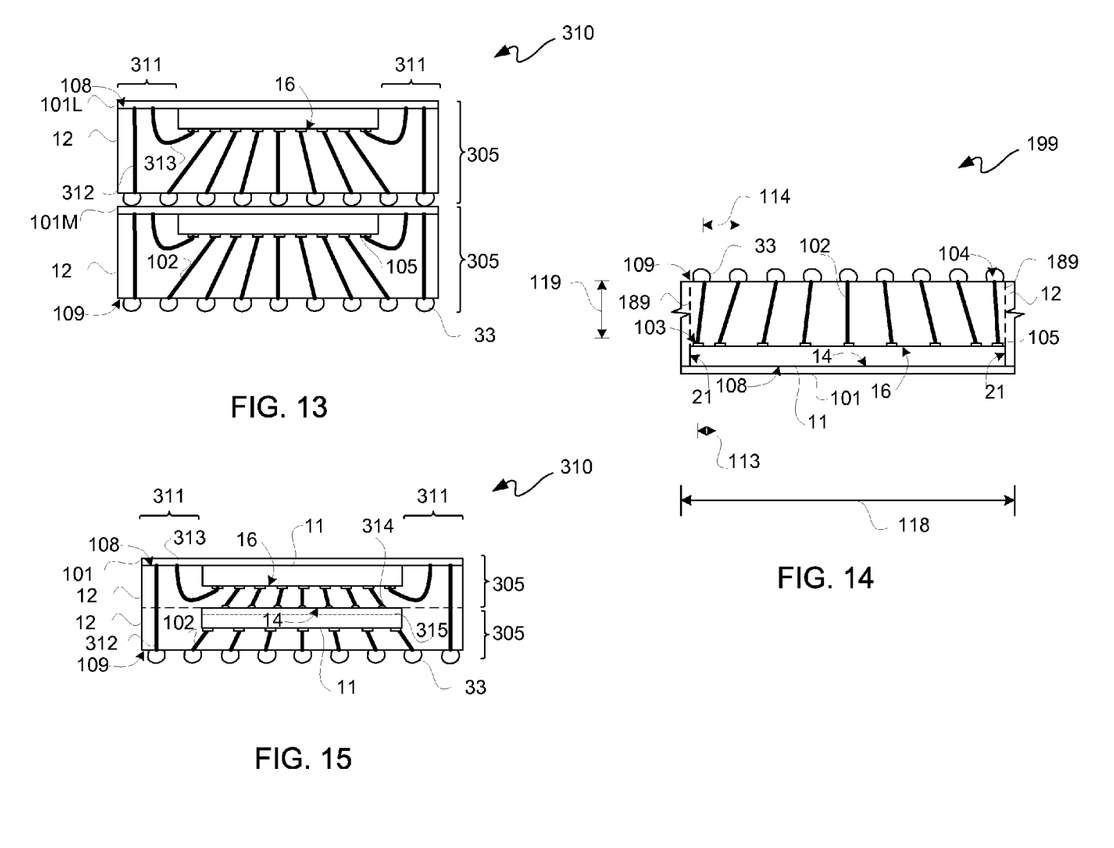
FIG. 13 is a side cross-sectional view depicting an exemplary package-on-package ("PoP") microelectronic device.
FIG. 14 is a schematic diagram depicting a cross-sectional side view of a portion of a fan-in only package.
FIG. 15 is a side cross-sectional view depicting another exemplary PoP microelectronic device.

FIG. 14 is a schematic diagram depicting a cross-sectional side view of a portion of a fan-in only package 199. FO region 115 is eliminated in fan-in only package 199. As many of the details regarding fan-in only package 199 are the same as described with reference to FIG. 2, generally such description is not repeated.

In this example, wire bond wires 102 extend over a lower surface 16 of microelectronic die 11. Again, substrate 101 may or may not be present in a final structure of fan-in only package 199. In this implementation, outer perimeter of molding material coverage around a final structure is at least 0.1 mm or more wider than microelectronic die 11. In other words, molding material 12 is at least 0.1 mm thick along sidewall surface 21 of microelectronic die 11. Wire bond wires 102 may be for coupling fan-in only package 199 to another circuit platform. In another implementation, molding material 12 may not be disposed outside of microelectronic die 11 along sidewall surface, as generally indicated by dashed lines 189. In such an implementation, molding material 12, as well as a bond via array ("BVA") structure of wire bond wires 102 partially encased in such molding material 12, may be disposed only over lower surface 16 of microelectronic die 11, where wire bond wires 102 may be formed for example on microelectronic dies 11 of a silicon wafer for WLP in contrast to a reconstituted wafer.

For purposes of clarity and not limitation, reconstituted wafer 100 of FIG. 2 is further described, as such description may likewise apply to fan-in only package 199 of FIG. 14.

Interconnects 33 may be coupled to distal ends 104 of wire bond wires 102. In this example, interconnects 33 may be solder balls 33. However, in another implementation, interconnects may be microbumps or another form of interconnects. Furthermore, in another implementation, contacts, such as metal pads, may be formed on outer surface 109 for coupling distal ends 104 to solder balls 33.

A minimum pitch 114 of some of the distal ends 104 may be at least a factor of 3 times greater than a minimum pitch 113 of proximal ends 103. Pitch 114 may be at least approximately 300 microns for interconnects 33, including ball grid array ("BGA") interconnects. Pitch 113 may be at most approximately 100 microns. Wire bond wires 102 may have a thickness in a range of approximately 15 to 50 microns. Such thicknesses may be substantially thicker than traces or wires in a conventional RDL.

Upper surface 14 of microelectronic die 11 may be coupled to an inner surface 108 of substrate 101. Molding material 12 may cover a portion of inner surface 108 of substrate 101 associated with FO region 115.

Wire bond wires 102 may be used instead of an RDL. Accordingly, no RDL need be used for WLP wire routing. Rather, wire bond wires 102 may be used. Additional thickness 119 added to reconstituted wafer 100 in comparison to a conventional reconstituted wafer 10 of FIG. 1 may be less than approximately 200 to 300 microns.

Figure 3:
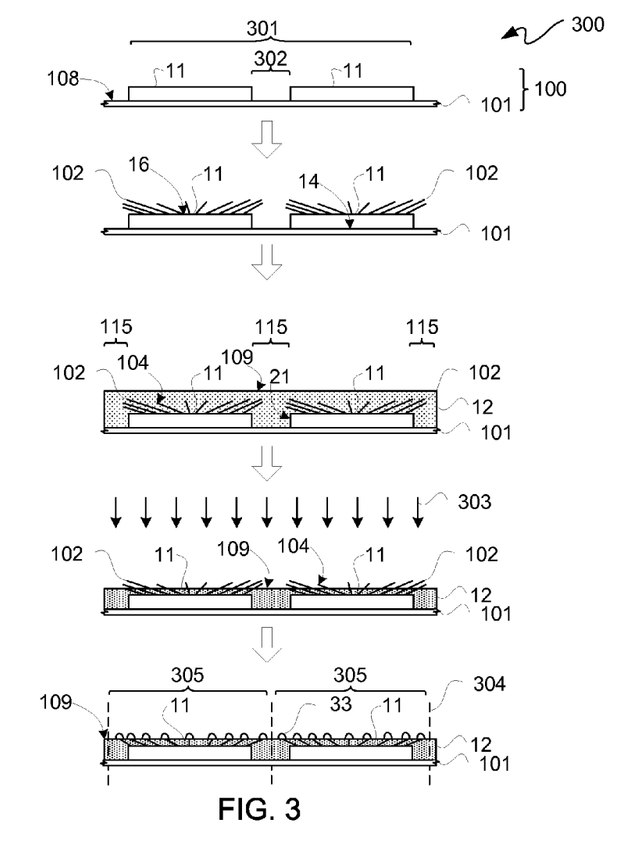
FIG. 3 is a progression of cross-sectional side views depicting an exemplary wafer-level packaging ("WLP") process for a reconstituted wafer.
Figure 4:
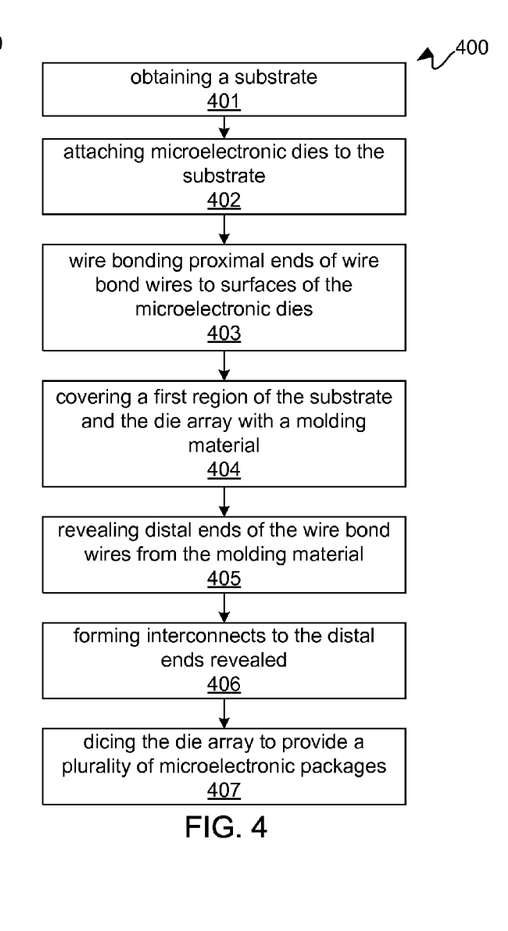
FIG. 4 is a flow diagram depicting another exemplary WLP process.

FIG. 3 is a progression of cross-sectional side views depicting an exemplary WLP process 300 for a reconstituted wafer 100. FIG. 4 is a flow diagram depicting an exemplary WLP process 400, which may correspond to WLP process 300 of FIG. 3. FIGS. 3 and 4 are further described with simultaneous reference to FIGS. 1 through 4.

At 401, a substrate 101 is obtained. At 402, microelectronic dies 11 may be attached, such as by epoxy, laminate or other adhesives in the form of film, tape or paste, to surface 108 of substrate 101 to form a die array 301 of microelectronic dies 101 to provide a reconstituted wafer 100. Gaps 302 may exist between sidewall surfaces 21 of neighboring dies of microelectronic dies 11.

At 403, proximal ends 103 of wire bond wires 102 may be wire bonded to upper surfaces 16 of microelectronic dies 11. Wire bonding at 403 may be stitch bonding and/or ball bonding.

At 404, an exposed area of substrate 101, including in gaps 302, as well as exposed surfaces of microelectronic dies 11 of die array 301 may be covered, by injection or other deposition, with a molding material 12. Such covering at 404 may include covering at least a majority length of lengths of wire bond wires 102, where such wire bond wires 102 have previously been wire bonded at 403 to then exposed or otherwise accessible surfaces of microelectronic dies 11 for such wire bonding. For an injection molding at 404, such injection molding may be performed without a film assist for release of a mold thereof.

At least a portion of such wire bond wires 102 attached to a microelectronic die 11, namely such portion of wire bond wires 102 wire bonded at 403, may extend outside or beyond a perimeter of such microelectronic die 11. At least such a portion of wire bond wires 102 may extend over gaps 302 of die array 301.

At 405, distal ends 104 of wire bond wires 102 may be revealed from molding material 12. This reveal may be performed with an etch back 303 of molding material 12 in this example to remove an upper potion thereof for revealing distal ends 104. This etch back 303 may be a plasma ("dry") etch or a chemical bath ("wet") etch. However, in another implementation, a polishing, such as a CMP, may be used for such reveal.

At 406, interconnects 33 may be formed for direct or indirect contact with or to distal ends 104 revealed at 405. Along those lines, this forming may include a printing of solder or a ball drop followed by reflow, as is known.

At 407, die array 301, which may or may not include substrate 101 may be diced 304 for singulation. This dicing may involve cuts, whether mechanical, laser, or otherwise, in gaps 302 to provide separate microelectronic packages 305. In this implementation, substrate 101 is diced, and thus sections of substrate 101 are included in microelectronic packages 305. Even though a single microelectronic die 11 per microelectronic package 305 is illustratively depicted, in another implementation more than one microelectronic die 11 per microelectronic package 305 may be used, which implementation may result for example by alternately not dicing between neighboring microelectronic dies 11.

However, substrate 101 may be removed prior to dicing at 407, and such substrate 101 may then be reused for another iteration of WLP process 300. For example, substrate 101 may be penetrated with UV rays and adhesive used to attach microelectronic dies 11 may be a UV soluble adhesive for release of substrate 101 after molding at 404. For providing a reconstituted wafer 100, substrate 101 may be a carrier wafer, and microelectronic dies 11 may be known good dies. Thus, microelectronic packages 305 may be diced from a reconstituted WLP with FO regions 115 associated with gaps 302, including sidewall surfaces 21 corresponding to portions of a perimeter of die array 301 proximal to a wafer's edge.

Figure 5:
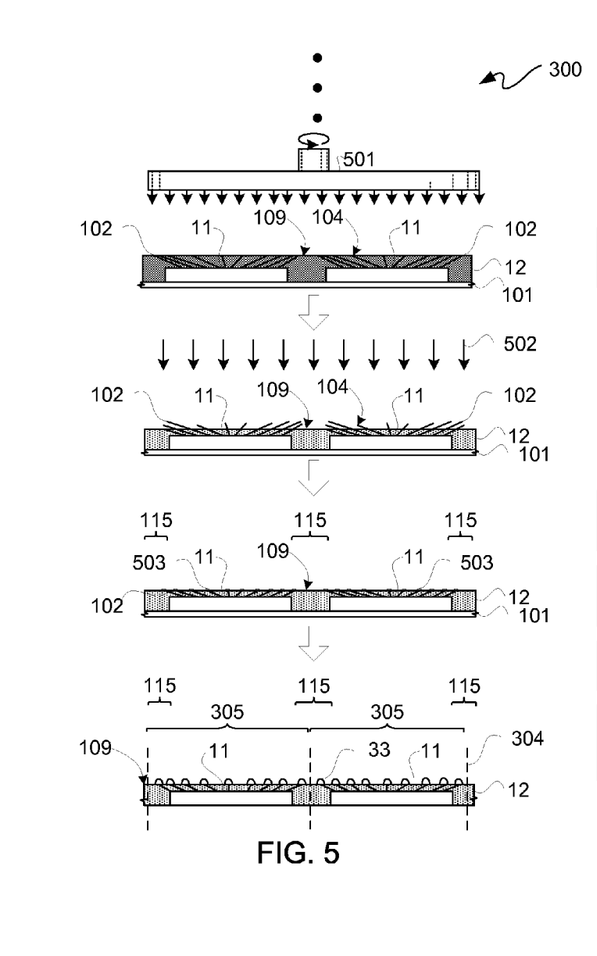
FIG. 5 is a progression of cross-sectional side views depicting yet another exemplary WLP process.
Figure 6:
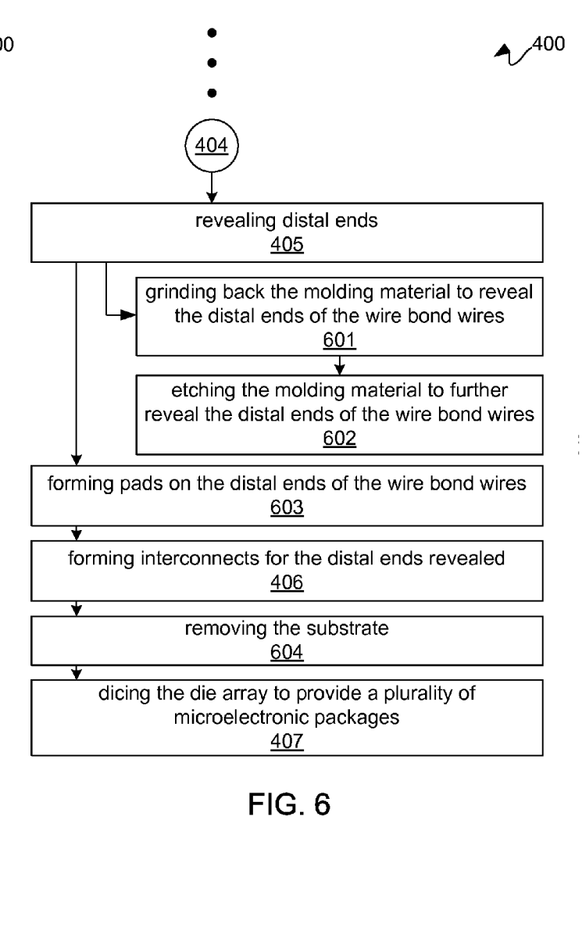
FIG. 6 is a flow diagram depicting still yet another exemplary WLP process.

FIG. 5 is a progression of cross-sectional side views depicting an exemplary WLP process 300 for a reconstituted wafer 100. FIG. 6 is a flow diagram depicting an exemplary WLP process 400, which may correspond to WLP process 300 of FIG. 5. WLP processes 300 and 400 respectively of FIGS. 3 and 4 have same operations up to and including covering a region of a substrate 101 and a die array 301 with a molding material 12. However, after operation 404, such processing is different as described below in additional detail. Accordingly, description of such same operations is not repeated for clarity. WLP processes 300 and 400 respectively of FIGS. 5 and 6 are further described with simultaneous reference to FIGS. 2 through 4.

At 405, distal ends 104 of wire bond wires 102 may be revealed from molding material 12. This reveal may be performed at 601 with a grinding back 501 of an upper surface 109 of molding material 12 to reveal distal ends 104 of wire bond wires 102. However, in another implementation, a polishing, such as a CMP, may be used for such reveal. After such a grind back at 601, a reveal at 405 may include at 602 an etch back of molding material 12 using etch 502, in this example to remove an upper portion of molding material 12 for revealing distal ends 104. This etch back at 602 may be a plasma ("dry") etch or a chemical bath ("wet") etch.

After revealing at 405, at 603 pads 503 may be formed on or at distal ends 104 of wire bond wires 102. This forming of pads 503 may be on an upper surface 109 of molding layer 12. Such forming may include forming a masking layer followed by seeding and electroplating or deposition of a metal, as is known.

At 406, interconnects 33 may be formed on pads 503 for coupling to distal ends 104 revealed at 405. Along those lines, this forming may include a printing of solder or a ball drop followed by reflow, as is known.

At 604, substrate 101 may be removed. Substrate 101 may be removed prior to dicing at 407 and sometime after molding at 404, and such substrate 101 may then be reused for another iteration of WLP process 300. For example, substrate 101 may be a glass or other translucent material capable of being penetrated with UV rays. An adhesive used to attach microelectronic dies 11 to substrate 101 may be a UV soluble adhesive for release of substrate 101 at 604 sometime after molding at 404 and prior to dicing at 407.

At 407, die array 11 may be diced 304 for singulation. This dicing may involve cuts, whether mechanical, laser, or otherwise, in gaps 302 to provide separate microelectronic packages 305. In this implementation, substrate 101 is not diced, and thus sections of substrate 101 are not included in microelectronic packages 305.

For providing a reconstituted wafer 100, substrate 101 may be a carrier wafer, and microelectronic dies 11 may be known good dies. Thus, microelectronic packages 305 may be diced from a reconstituted WLP with FO regions 115 associated with gaps 302, including sidewall surfaces 21 corresponding to portions of a perimeter of die array 301.

Figure 7:
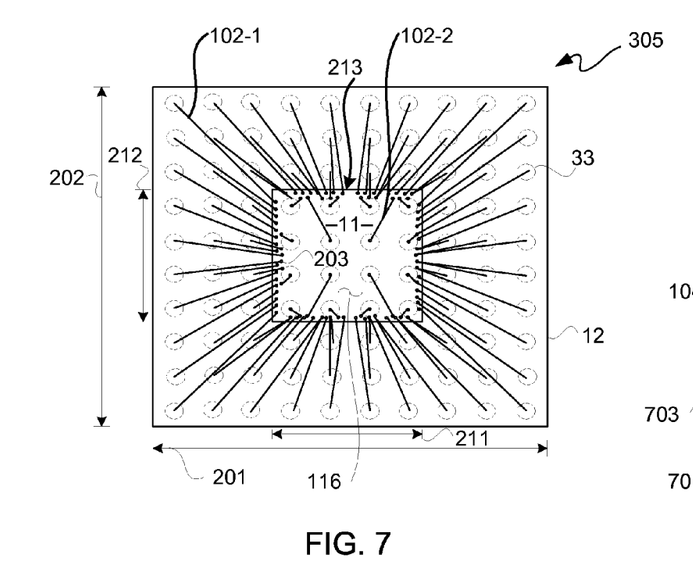
FIG. 7 is a top plan view depicting an exemplary in-process microelectronic package prior to completion of molding.
Figure 8:
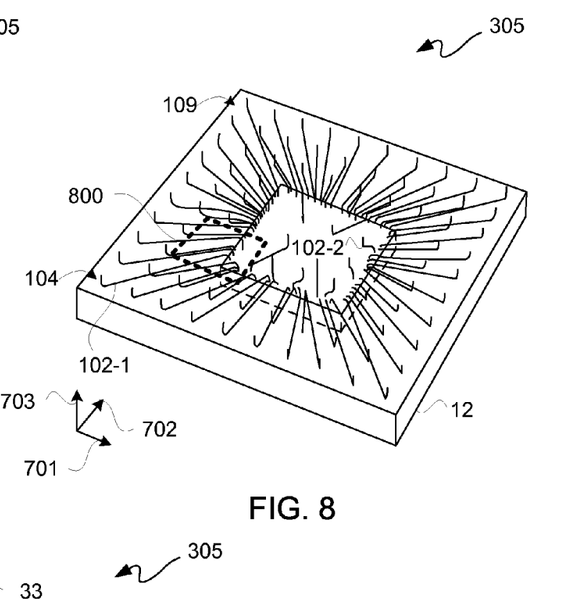
FIG. 8 is a perspective view depicting an exemplary in-process microelectronic package prior to completion of molding.
Figure 9:
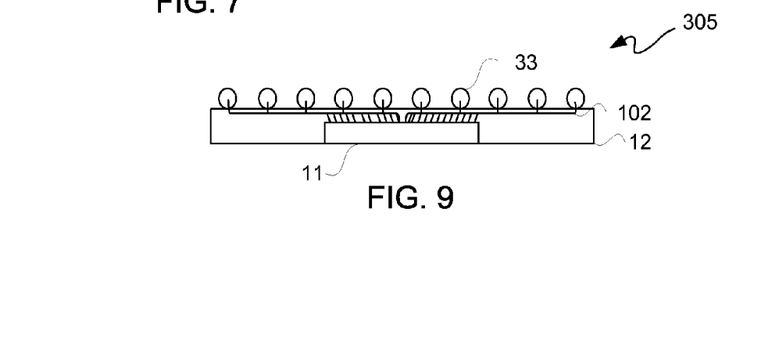
FIG. 9 is a side cross-sectional view depicting an exemplary microelectronic package after forming solder balls.

FIG. 7 is a top plan view depicting an exemplary in-process microelectronic package 305 prior to completion of molding. FIG. 8 is a perspective view depicting an exemplary in-process microelectronic package 305 prior to completion of molding. FIG. 9 is a side cross-sectional view depicting an exemplary microelectronic package 305 after forming solder balls 33. Microelectronic package 305 of FIGS. 7 through 9 is further described with simultaneous reference to FIGS. 2 through 9.

Positional accuracy of wire bond wires 102 when made as generally straight vertical wires from a surface of a microelectronic die 11 may be: approximately +/−20 microns in an x-direction 701; approximately +/−20 microns in a y-direction 702 with reference to corresponding contact pads 203 of microelectronic die 11 in an x-y plane of surface 16 of microelectronic die 11; and approximately +/−40 microns in a z-direction 703 orthogonal to such x-y plane. Width 211 and length 212 of microelectronic die 11 may each be respectively equal to or smaller than width 201 and length 202 of microelectronic package 305. From the above description, it should be appreciated that BGA pitch may be substantially larger than pitch of contacts 203. Accordingly, a substantial amount of alignment tolerance is provided for distal ends 104 of wire bond wires 102. However, for dense contact areas, wire bond wires 102 may be reduced in one or more solder ball 33 depopulation regions, such as region 800, for example.

Wire bond wires 102 may include slanted-out wire bond wires 102-1 and/or slanted-in wire bond wires 102-2. Microelectronic die 11 may have a perimeter 213, and proximate to such perimeter may be contacts 203. In this example, contracts 203 are distributed around such perimeter 213 of microelectronic die 11; however, in another implementation, such contacts 203 may not be proximate to all edges of perimeter 213 of microelectronic die 11.

Slanted-in wire bond wires 102-2 extend from such contacts 203 to a fan-in ("FI") region 116 ending over a surface area associated with contacts 203 within perimeter 213 of microelectronic die 11. Slanted-in wire bond wires 102-2, which may include touched-down transverse-upward formed wires, may extend over a central region of surface 16 of microelectronic die 11 inside perimeter 213 into an FI region 116.

Slanted-out wire bond wires 102-1 extend from such contacts 203 to an FO region 115 ending outside a surface area associated with contacts 203 within perimeter 213 of microelectronic die 11. For slanted-out wire bond wires 102-1, such slanted-out wire bond wires 102-1 may include generally transverse portions prior to a touched-down contact point to an upper surface 109 of molding material 12, and from such contact point, such touched-down wires may be formed in an upward direction to provide a distal end 104. For slanted-in wire bond wires 102-2, such contact point may be on a surface 16 of microelectronic die 11. Wire bond wires 102 may be coupled to contacts 203 with either or both ball bonding or stitch bonding to such contracts 203 of microelectronic die 11. As shown in FIGS. 7-9 the bond wires 102-1 and 102-2 may have one or more portions that are bent or kinked connecting portions that are generally more parallel to the surface of the microelectronic package 305 or microelectronic die 11 with other portions that are generally more perpendicular to the surface of the microelectronic package 305 or microelectronic die 11.

Figure 10:
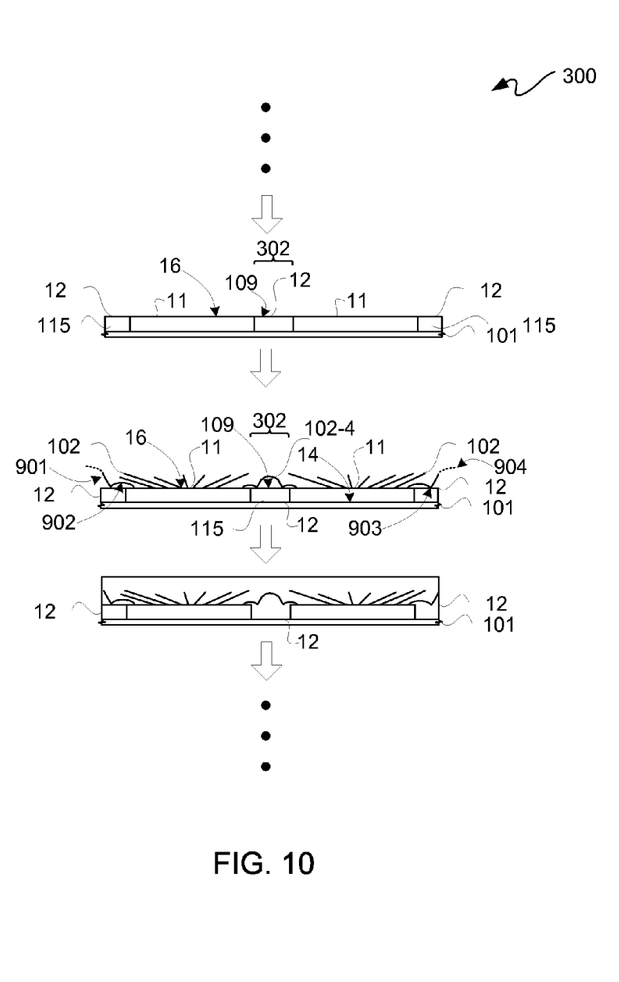
FIG. 10 is a progression of cross-sectional side views depicting further yet another exemplary WLP process for a reconstituted wafer.
Figure 11:
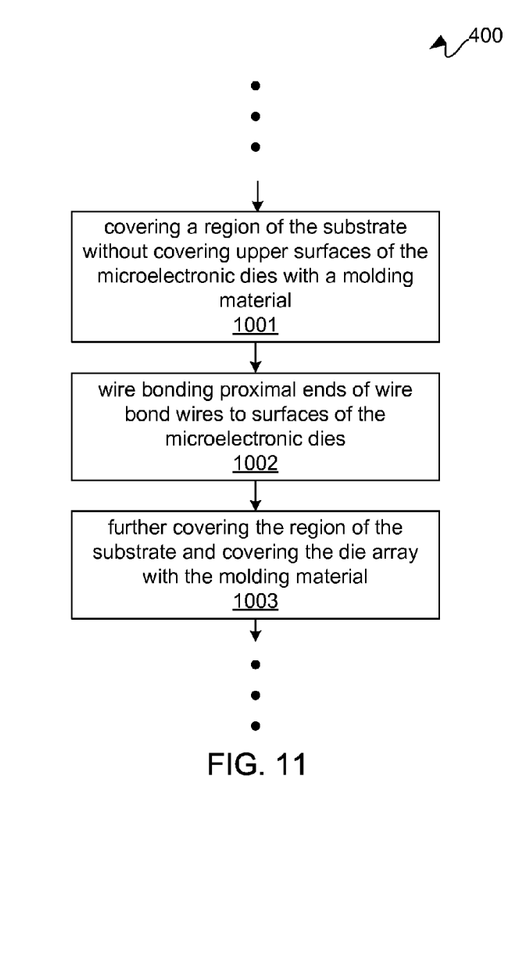
FIG. 11 is a flow diagram depicting still further yet another exemplary WLP process.

FIG. 10 is a progression of cross-sectional side views depicting an exemplary WLP process 300 for a reconstituted wafer 100. FIG. 11 is a flow diagram depicting an exemplary WLP process 400, which may correspond to WLP process 300 of FIG. 10. WLP processes 300 and 400 respectively of FIGS. 10 and 11 may have same operations as described in FIGS. 3 and 4 for further covering a region of a substrate 101 and covering a die array 301 with a molding material 12. As operations 401 and 402 may be the same as previously described, such description is not repeated for purposes of clarity. Furthermore, operations after operation 404 may be the same, and so such description is not repeated for purposes of clarity. WLP process 300 and 400 respectively of FIGS. 10 and 11 is further described with simultaneous reference to FIGS. 2 through 11.

At 1001, a region of substrate 101, including gaps 302, is covered with a molding material 12. Such molding material 12 may be injected to be generally level with surface 16.

At 1002, wire bond wire may be drawn with proximal ends 103 bonded to contacts 203 of microelectronic die 11 followed by drawing such wire bond wire to form wire bond wires 102. For some wire bond wires 102, they may be drawn generally traverse with respect to surface 16 and surface 109 to a touch-down contact point 903 on surface 109. This traverse section 902 of such wire bond wires 102 may extend into a FO region 115. From touch-down contact point 903 on surface 109, wire bond wire 102 may be drawn away, such as upwardly for example, from surface 109 to form an upward section 901 of such wire bond wires 102. Because formation of wire bond wires 102 may be continuous as between microelectronic dies 11 over gaps 302, some wire bond wires 102-4 may extend to a neighboring microelectronic die 11 until being severed, such as by dicing, to provide separate wire bond wires 102-1 for such neighboring microelectronic dies 11. This continuation of a wire bond wire 102 to a neighboring die for a subsequent touch-down followed by a subsequent bonding is generally indicated by dashed line 904.

At 1003, such FO region 115 may be further covered with molding material 12 along with covering die array 301, as well as wire bond wires 102, with such molding material. Molding material 12 may have a thickness above surface 16 of microelectronic die 11 of at least 50 microns in some implementations.

Figure 121:
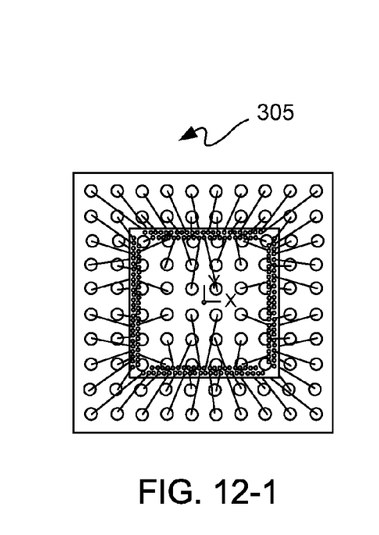
Figure 122:
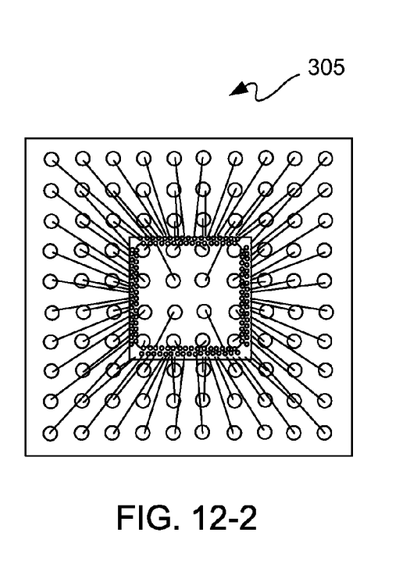
Figure 123:
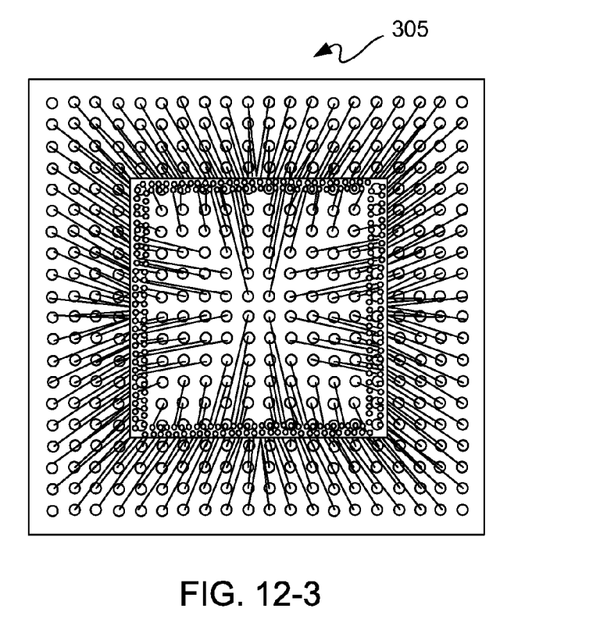

FIGS. 12-1 through 12-3 are top plan views depicting respective exemplary microelectronic packages 305 of different sizes. For purposes of clarity and not limitation, underlying components, such as wire bond wires 102, contacts 203, and microelectronic dies 11 for example, in such microelectronic packages 305 of different sizes of microelectronic dies 11 are illustratively shown. For example, a die size of microelectronic die 11 may be in a range of approximately 1-by-1 to 12-by-12 millimeters. A package size associated with such microelectronic packages 305 may be in a range of approximately 1-by-1 to 30-by-30 millimeters. Accordingly, use of wire bond wires 102 in place of an RDL is scalable for different die sizes and different package sizes. Along those lines, any of a variety of pin counts, namely number of contacts 203, may be used, which may vary from microelectronic die-to-microelectronic die.

FIG. 13 is a side cross-sectional view depicting an exemplary package-on-package ("PoP") microelectronic device 310. FIG. 13 is described further with simultaneous reference to FIGS. 2 through 13.

In FIG. 13, at least two microelectronic packages 305 are stacked one on top of another in a columnar alignment. Solder balls 33 of an upper microelectronic package 305 may be interconnected to a substrate 101M of a lower microelectronic package 305. Substrate 101M may include an organic substrate, tape, RDL, and/or the like to provide additional contact pads and routing (not shown for purposes of clarity and not limitation) for coupling between microelectronic packages 305. FO regions 115 of upper and lower microelectronic packages 305 may be aligned to one another to provide avenues 311 for routing.

For a PoP microelectronic device 310, each of microelectronic packages 305 may optionally include wire bond wires 312 and/or 313. Wire bond wires 312 may extend from corresponding solder balls 33 along an outer surface 109 of molding material 12 through molding material 12 to an inner surface 108 of a substrate 101 of a microelectronic package 305. Wire bond wires 313 may extend between BEOL pads 105 of microelectronic die 11 as part of lower surface 16 to an inner surface 108 of substrate. In certain implementations, the top package may not have peripheral wire bond wires 312 or 313.

FIG. 15 is a side cross-sectional view depicting another exemplary PoP microelectronic device 310. FIG. 15 is described further with simultaneous reference to FIGS. 2 through 15.

In FIG. 15, at least two microelectronic packages 305 are stacked one on top of another in a microelectronic die 11 alignment. Even though same microelectronic dies 11 are used in this example for both of microelectronic packages, such as for stacked memory dies for example, in another implementation different microelectronic dies may be used. Along those lines, different microelectronic packages 305 may be used with same or different microelectronic dies 11. Micro bumps 314 or other solder masses may be disposed on upper surface 14 of a lower microelectronic die 11 of a lower microelectronic package 305 for interconnecting with distal ends of wire bond wires 102 of an upper microelectronic package 305. In this configuration, lower microelectronic die 11 may have through substrate vias (not shown) for interconnecting a substrate 315 of such microelectronic die 11 of such lower microelectronic package 305 to such distal ends of wire bond wires 102 of such upper microelectronic package 305.

In this example implementation, a lower microelectronic package 305 does not have a substrate 101, and an upper microelectronic package 305 includes a substrate 101. In this example implementation, FO regions 115 of upper and lower microelectronic packages 305 may be aligned to one another to provide avenues 311 for routing, including without limitation through PoP routed wire bond wires 312. Wire bond wires 312 may extend substantially beyond molding material 12 of upper microelectronic package 305, and may be inserted into corresponding holes in molding material 12 of lower microelectronic package 305, as generally delineated with a dashed line. These holes may subsequently be filled with additional molding material 12 or other fill material. Moreover, upper microelectronic package 305 may include wire bond wires 313, as previously described.

Figure 16:
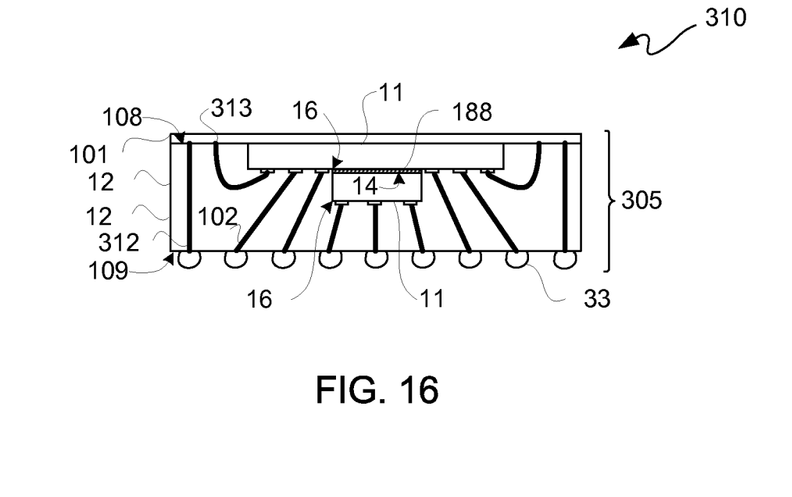
FIG. 16 is a side cross-sectional view depicting an exemplary stacked die microelectronic device.

FIG. 16 is a side cross-sectional view depicting an exemplary stacked die microelectronic device 310. FIG. 16 is described further with simultaneous reference to FIGS. 2 through 16.

A bonding layer 188 or other interface layer may be disposed on upper surface 14 of a lower microelectronic die 11 and a lower surface 16 of an upper microelectronic die 11 to provide a microelectronic package 305. In this example implementation, an FO region 115 of lower microelectronic die 11 may be within an FI region of a larger upper microelectronic die 11. Wire bond wires 312 may extend from lower surfaces 16 of microelectronic dies 11 beyond molding material 12. Other features of microelectronic package 305 have been previously described, and thus are not repeated for purpose of clarity and not limitation.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A microelectronic package, comprising:
a microelectronic die having a first surface, a second surface opposite the first surface, and a sidewall surface between the first and second surfaces;
a plurality of wire bond wires with proximal ends thereof coupled to either the first surface or the second surface of the microelectronic die with distal ends of the plurality of wire bond wires extending away from either the first surface or the second surface, respectively, of the microelectronic die;
a portion of the plurality of wire bond wires extending outside a perimeter of the microelectronic die into a fan-out ("FO") region; and
a molding material for covering the first surface, the sidewall surface, and portions of the plurality of the wire bond wires from the first surface of the microelectronic die to an outer surface of the molding material;
wherein the plurality of wire bond wires include both first directed wire bond wires extending to the FO region and second directed wire bond wires extending to a fan-in ("FI") region.

2. The microelectronic package according to claim 1, further comprising:
interconnects coupled to the distal ends of the plurality of wire bond wires;
wherein a first pitch of the distal ends is at least a factor of 3 times greater than a second pitch of the proximal ends.

3. The microelectronic package according to claim 2, further comprising:
a substrate;
wherein the second surface of the microelectronic die is coupled to an inner surface of the substrate; and
wherein the molding material covers a portion of the inner surface of the substrate associated with the FO region.

4. The microelectronic package according to claim 3, wherein the first directed wire bond wires and the second directed wire bond wires respectively include slanted-out wire bond wires extending to the FO region and slanted-in wire bond wires extending to the region.

5. The microelectronic package according to claim 4, wherein the plurality of wire bond wires include touch-down wire bond wires.

6. The microelectronic package according to claim 3, wherein the plurality of wire bond wires are either ball bonded or stitch bonded to contacts of the microelectronic die.

7. The microelectronic package according to claim 3, wherein:
the first pitch is at least approximately 300 microns for the interconnects; and
the second pitch is at most approximately 100 microns.

8. The microelectronic package according to claim 3, wherein the plurality of wire bond wires have a thickness in a range of approximately 15 to 50 microns.

9. The microelectronic package according to claim 3, wherein:
a die size of the microelectronic die is in a range of approximately 1-by-1 to 12-by-12 millimeters; and
a microelectronic package size associated is in a range of approximately 1-by-1 to 30-by-30 millimeters.

10. The microelectronic package according to claim 3, wherein:
at least a majority of contacts of the microelectronic die are disposed on the first surface of the microelectronic die proximal to the perimeter thereof with no or a minority of the contacts in a central region of the first surface of microelectronic die;
the portion of the plurality of wire bond wires is a first portion thereof; and
a second portion of the plurality of wire bond wires extend over the central region of the first surface of the microelectronic die inside the perimeter of the microelectronic die into the region.

11. The microelectronic package according to claim 3, wherein the molding material has a thickness above the first surface of the microelectronic die of at least 50 microns.

12. A package-on-package microelectronic device having a first microelectronic package and a second microelectronic package each of which is according to claim 1, the package-on-package microelectronic device comprising:
the first microelectronic package stacked on the second microelectronic package, wherein solder masses of the first microelectronic package are coupled to a substrate of the second microelectronic package; and
the substrate of the second microelectronic package extending outside the perimeter of the microelectronic die thereof into the FO region thereof.

13. A package-on-package microelectronic device having a first microelectronic package according to claim 1, the package-on-package microelectronic device comprising:
the first microelectronic package stacked on a second microelectronic package, wherein solder masses of the first microelectronic package are coupled to a substrate of the second microelectronic package; and
the substrate of the second microelectronic package being of a microelectronic die of the second microelectronic package.

14. A die-on-die microelectronic device having the microelectronic die according to claim 1 as a first microelectronic die and having a second microelectronic die stacked on the first microelectronic die, wherein:
each of the first microelectronic die and the second microelectronic die have a lower surface as either the first surface or the second surface thereof;
the plurality of wire bond wires have the proximal ends thereof coupled to the lower surface of each of the first microelectronic die and the second microelectronic die with distal ends of the plurality of wire bond wires extending away from the lower surface respectively of the first microelectronic die and the second microelectronic die; and
the molding material for covering the lower surface of each of the first microelectronic die and the second microelectronic die and portions of the plurality of the wire bond wires from the lower surface of each the first microelectronic die and the second microelectronic die to the outer surface of the molding material.

15. A method for wafer-level packaging, comprising:
obtaining a substrate;
attaching microelectronic dies to the substrate to form a die array of the microelectronic dies having gaps between neighboring dies of the microelectronic dies;
wire bonding proximal ends of wire bond wires to the microelectronic dies;
covering the substrate, including the die array, with a molding material;

wherein the covering includes covering at least a majority length of lengths of the wire bond wires wire bonded to the microelectronic dies;

wherein at least a portion of the wire bond wires extend outside corresponding perimeters of the microelectronic dies corresponding thereto;

revealing distal ends of the wire bond wires from the molding material;

forming interconnects for the distal ends revealed; and dicing the die array to provide microelectronic packages.

16. The method according to claim 15, wherein:
the substrate is a carrier wafer;
the microelectronic dies are known good dies; and
the microelectronic packages are diced from a reconstituted wafer-level package with a fan-out ("FO") region associated with the gaps.

17. The method according to claim 15, wherein the revealing comprises etching back the molding material to reveal the distal ends of the wire bond wires.

18. The method according to claim 15, wherein the revealing comprises:

grinding back the molding material to the distal ends of the wire bond wires; and etching the molding material to reveal the distal ends of the wire bond wires for the interconnects.

19. The method according to claim 15, further comprising removing the substrate prior to the dicing.

20. The method according to claim 19, wherein:

the covering of the substrate including the die array with the molding material comprises first covering a region of the substrate without covering upper surfaces of the microelectronic dies with the molding material;

the wire bonding of the proximal ends of the wire bond wires to the microelectronic dies is performed after the first covering; and the covering of the substrate including the die array with the molding material comprises second covering the region of the substrate including the die array with the molding material after the wire bonding.

* * * * *